United States Patent
Cho

(10) Patent No.: US 11,265,005 B2
(45) Date of Patent: Mar. 1, 2022

(54) DEVICE AND METHOD FOR ANALOG-DIGITAL CONVERSION

(71) Applicant: HYUNDAI AUTOEVER CORP., Seoul (KR)

(72) Inventor: Jun Ho Cho, Seoul (KR)

(73) Assignee: HYUNDAI AUTOEVER CORP., Seoul (KR)

(*) Notice: Subject to any disclaimer, the term of this patent is extended or adjusted under 35 U.S.C. 154(b) by 0 days.

(21) Appl. No.: 17/112,466

(22) Filed: Dec. 4, 2020

(65) Prior Publication Data

US 2021/0203343 A1 Jul. 1, 2021

(30) Foreign Application Priority Data

Dec. 27, 2019 (KR) .................. 10-2019-0176305

(51) Int. Cl.
*H03M 1/12* (2006.01)
*G06F 3/05* (2006.01)
*H03M 1/50* (2006.01)

(52) U.S. Cl.
CPC ............ *H03M 1/122* (2013.01); *G06F 3/05* (2013.01); *H03M 1/50* (2013.01)

(58) Field of Classification Search
CPC .......... H03M 1/122; H03M 1/50; H03M 1/12; H03M 1/1225; H03M 1/124; G06F 3/05
USPC ...................................................... 341/155
See application file for complete search history.

(56) References Cited

U.S. PATENT DOCUMENTS

| 8,117,360 | B2* | 2/2012 | Iwagami | G06F 13/126 |
| | | | | 710/59 |
| 9,450,740 | B2* | 9/2016 | Takano | H04W 72/1289 |
| 10,181,859 | B2* | 1/2019 | Barrenscheen | H03M 1/122 |
| 10,594,331 | B2* | 3/2020 | Hayashi | H03M 1/123 |
| 10,841,811 | B2* | 11/2020 | Tomeba | H04L 5/0091 |
| 10,917,104 | B2* | 2/2021 | Kang | H03M 1/126 |
| 2008/0071949 | A1* | 3/2008 | Iwagami | G06F 13/126 |
| | | | | 710/71 |
| 2018/0288638 | A1* | 10/2018 | Kato | H04L 41/0677 |
| 2019/0059118 | A1* | 2/2019 | Kato | H04W 72/048 |
| 2019/0158236 | A1* | 5/2019 | Yoo | H04L 5/0078 |
| 2019/0230521 | A1* | 7/2019 | Tomeba | H04B 7/06 |
| 2019/0253064 | A1* | 8/2019 | Hayashi | H03M 1/0624 |

FOREIGN PATENT DOCUMENTS

| JP | 5365551 B2 | 9/2013 |
| KR | 10-2014-0092131 A | 7/2014 |
| KR | 10-1534974 B1 | 7/2015 |

\* cited by examiner

*Primary Examiner* — Jean B Jeanglaude
(74) *Attorney, Agent, or Firm* — Morgan, Lewis & Bockius LLP

(57) ABSTRACT

An analog-digital conversion apparatus may include a control unit configured for receiving an analog-digital (AD) conversion request from a plurality of processing modules; and an analog-digital converter (ADC) configured for performing analog-digital conversion according to the AD conversion request received from the control unit, in which the control unit is configured to integrate the AD conversion request according to periodicity of the AD conversion request and to transfer the integrated AD conversion request to the ADC.

19 Claims, 5 Drawing Sheets

FIG. 2

| | PERIODICITY OR NOT | PERIOD [ms] | DELAY ALLOWANCE TIME [ms] | ADC CHANNEL |
|---|---|---|---|---|
| FIRST PROCESSING MODULE (12a) | × | - | 3 | 1 |
| SECOND PROCESSING MODULE (12b) | ○ | 10 | - | 2 |
| THIRD PROCESSING MODULE (12c) | × | - | 2 | 4 |
| FOURTH PROCESSING MODULE (12d) | ○ | 20 | - | 5 |
| FIFTH PROCESSING MODULE (12e) | × | - | 5 | 8 |

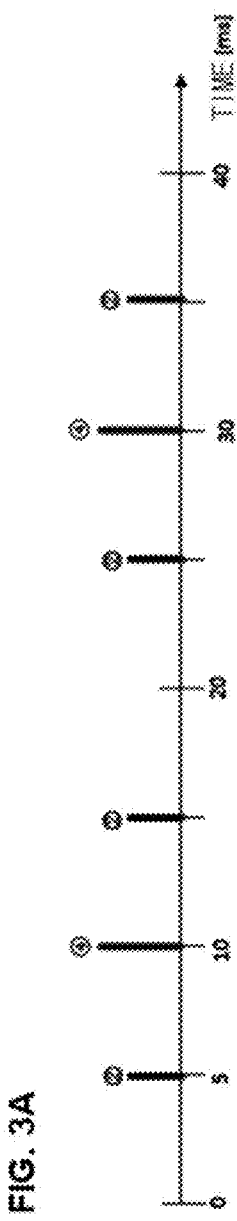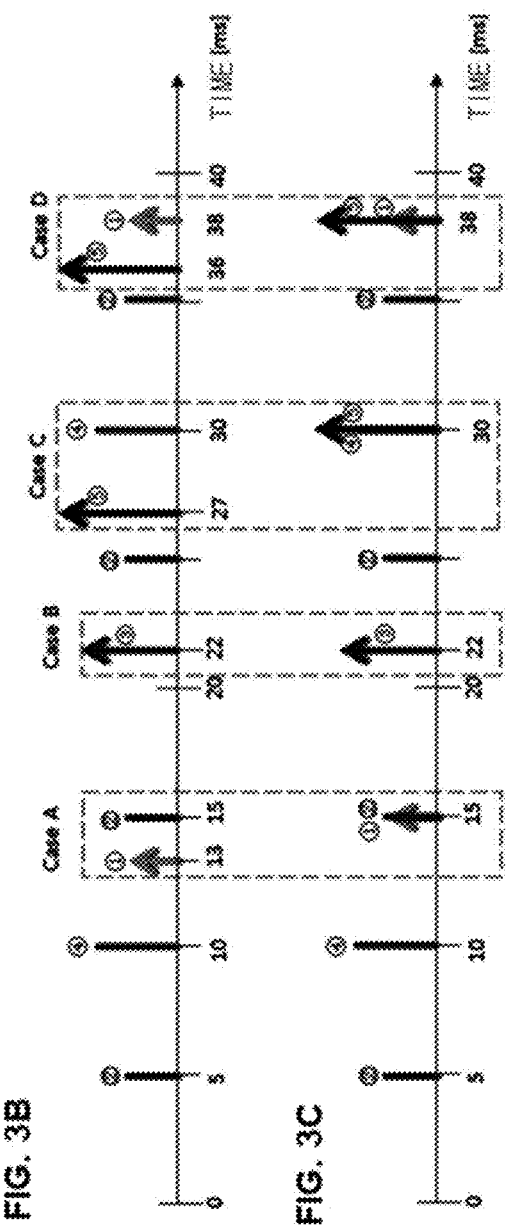
FIG. 3A
FIG. 3B
FIG. 3C

DEVICE AND METHOD FOR ANALOG-DIGITAL CONVERSION

CROSS-REFERENCE TO RELATED APPLICATIONS

The present application claims priority to Korean Patent Application No. 10-2019-0176305 filed on Dec. 27, 2019, the entire contents of which is incorporated herein for all purposes by this reference.

BACKGROUND OF THE INVENTION

Field of the Invention

The present invention relates to an apparatus and a method for analog-digital conversion. More particularly, the present invention relates to an apparatus and a method for analog-digital conversion, which are configured for integrating and processing a plurality of analog-digital signal conversion requests.

Description of Related Art

As safety and productivity issues increase in an automotive industry, the demand for a standardized software platform to ensure reliability and reusability is increasing. AUTomotive Open System Architecture (AUTOSAR) is a software standard platform for vehicle electronic portions developed for the reliability and reusability, focusing on the development of commercial vehicles with platforms developed by many automotive companies based on the AUTOSAR.

The AUTOSAR is mounted on an electronic control unit (ECU) which is a basic unit of vehicle control, and each of ECUs is constituted by a basic software (BSW) module for performing a function and application software components which operate thereon, and a runtime environment (RTE) that supports communication therebetween.

Meanwhile, the electronic control unit mounted on a vehicle in the related art utilizes a microcontroller (MCU) for each control function. The MCU had only one core, but in recent years, a multi-core MCU with a plurality of cores embedded therein has been used and the MCU has been developed to a form in which respective cores may perform separate control functions.

There are multiple needs to receive an analog-type signal and convert the received analog-type signal into a digital signal during a process of performing the vehicle control in the ECU. However, even when an analog-digital converter converting an analog signal into the digital signal includes a plurality of channels, when the analog signal is converted into the digital signal through any one channel, signal conversion through other channels is impossible. That is, when analog-digital signal conversion through any one channel is performed, analog-digital signal conversion through other channels is disregarded (ADC just returns Not OK).

Even when the multi-core MCU is used, as respective cores individually request AD conversion to an analog-digital converter (ADC) that converts the analog signal into the digital signal, when any one core requests the signal conversion by the ADC, there is a case where AD conversion requests of other cores are unsuccessful.

There is a problem in that a lot of loads are consumed even in a process of reading a conversion result from the ADC, and as a result, a load of an entire platform increases.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing an apparatus and a method for analog-digital conversion, which are configured for increasing analog-digital conversion efficiency and reducing a system load by integrating and processing digital conversion requests of a plurality of analog signals.

Various aspects of the present invention are directed to providing an analog-digital conversion apparatus including: a control unit configured for receiving an analog-digital (AD) conversion request from a plurality of processing modules; and an analog-digital converter (ADC) configured for performing analog-digital conversion according to the AD conversion request received from the control unit, in which the control unit is configured to integrate the AD conversion request according to periodicity of the AD conversion request and to transfer the integrated AD conversion request to the ADC.

In various exemplary embodiments of the present invention, when the AD conversion request is periodic, the control unit may transfer the AD conversion request to the ADC at a predetermined time interval.

In various exemplary embodiments of the present invention, when the AD conversion request is an aperiodic AD conversion request, the control unit may integrate a periodic AD conversion request to be performed after the aperiodic AD conversion request, and the aperiodic AD conversion request.

In the aperiodic AD conversion request, a delay allowance time which is an allowable delay time for AD conversion may be set, and when the delay allowance time is equal to or greater than a time up to the periodic AD conversion request, the control unit may integrate the aperiodic AD conversion request in the periodic AD conversion request.

In the aperiodic AD conversion request, the delay allowance time which is the allowable delay time for AD conversion may be set, and when the delay allowance time is less than the time up to the periodic AD conversion request, the control unit may separately process the aperiodic AD conversion request.

In various exemplary embodiments of the present invention, the control unit may include a transmission/reception unit configured for transmitting and receiving a signal, a conversion information storing unit configured for storing information related to the plurality of processing modules requesting the AD conversion, and an AD conversion integrating unit configured for integrating and transferring the AD conversion request.

The conversion information storing unit may store, as conversion information, whether the AD conversion request is periodic, a delay allowance time when the AD conversion request is aperiodic, and channel information related to the ADC to be allocated for the AD conversion request.

In various exemplary embodiments of the present invention, the analog-digital conversion apparatus may further include a multi-core microprocessor including, a first core, a second core, and a peripheral apparatus, in which the processing module and the control unit may be provided in the first core, the ADC may be included in the peripheral apparatus, and an input/output apparatus receiving the AD conversion request in the control unit and transferring the AD conversion request to the ADC may be provided in the second core.

The peripheral apparatus may include a common memory receiving the AD conversion request from the first core and temporarily storing the AD conversion request and temporarily storing an AD conversion result from the ADC.

Various aspects of the present invention are directed to providing a method for converting an analog signal into a digital signal, which includes: (a) receiving, by a control unit, an analog-digital (AD) conversion request from a plurality of processing modules; (b) determining, by the control unit, periodicity of the AD conversion request; and (c) when the AD conversion request is an aperiodic AD conversion request, performing, by the control unit, AD conversion by determining whether to integrate a periodic AD conversion request to be performed after the aperiodic AD conversion request, and the aperiodic AD conversion request.

In various exemplary embodiments of the present invention, in step (c), a delay allowance time of the aperiodic AD conversion request and a time A up to the periodic AD conversion request to be performed after the aperiodic AD conversion request may be compared with each other and when the delay allowance time is equal to or greater than the time A, the aperiodic AD conversion request may be integrated with the periodic AD conversion request.

In various exemplary embodiments of the present invention, in step (c), the delay allowance time of the aperiodic AD conversion request and the time A up to the periodic AD conversion request to be performed after the aperiodic AD conversion request may be compared with each other and when the delay allowance time is less than the time A, the aperiodic AD conversion request may be separately processed.

In various exemplary embodiments of the present invention, when the aperiodic AD conversion request is separately processed from the periodic AD conversion request, the aperiodic AD conversion request may be integrated and processed when there is another aperiodic AD conversion request within an AD conversion waiting time less than the delay allowance time.

According to various exemplary embodiments of the present invention, it is possible to increase analog-digital conversion efficiency and reduce a system load by integrating and processing digital conversion requests of a plurality of analog signals.

According to various exemplary embodiments of the present invention, a problem in that the conversion request is rejected during an analog-digital conversion process may be solved.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 2 is a diagram exemplarily illustrating AD conversion information in an analog-digital conversion apparatus according to various exemplary embodiments of the present invention.

FIG. 3A, FIG. 3B, and FIG. 3C are diagrams exemplarily illustrating that an AD conversion request is integrated and processed based on the AD conversion information illustrated in FIG. 2.

Figure 1:
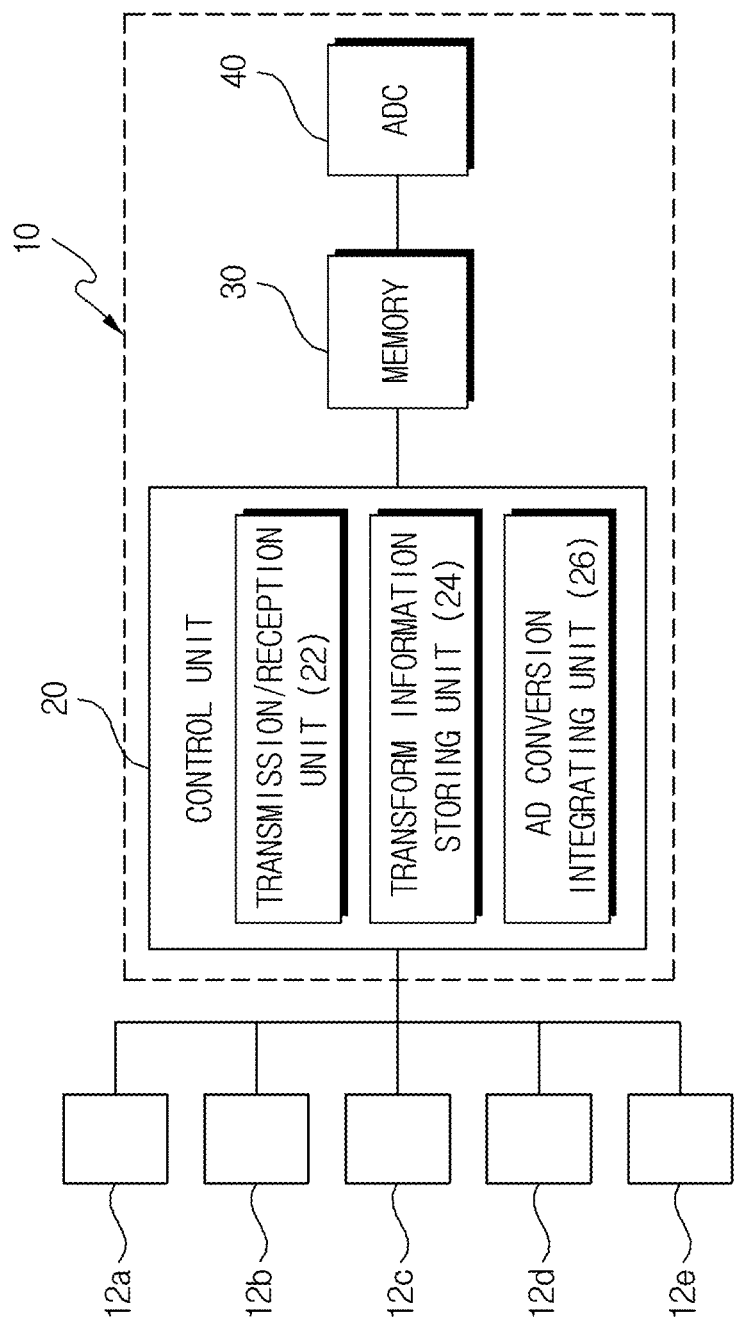
FIG. 1 is a block diagram of an analog-digital conversion apparatus according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, an exemplary various exemplary embodiments of the present invention will be described in detail with reference to the accompanying drawings. First, when reference numerals refer to components of each drawing, it is to be noted that although the same components are illustrated in different drawings, the same components are denoted by the same reference numerals as possible. Furthermore, in describing the present invention, a detailed description of known related configurations and functions may be omitted to avoid unnecessarily obscuring the subject matter of the present invention. Furthermore, hereinafter, the exemplary embodiment of the present invention will be described, but the technical spirit of the present invention is not limited thereto or restricted thereby and the exemplary embodiments may be modified and variously executed by those skilled in the art.

FIG. 1 is a block diagram of an analog-digital conversion apparatus according to various exemplary embodiments of the present invention.

In a vehicle control, analog-digital conversion (hereinafter, referred to as 'AD conversion') is required with respect to various elements including a current or voltage value for battery monitoring, a detecting value of an analog sensor such as a radar or an ultrasonic sensor, steering angle sensing, and the like.

In FIG. 1, a plurality of processing modules 12 requesting the AD conversion is illustrated. The processing module 12 may be various application programs for vehicle control, a sensor processing module, a battery monitoring module, etc. For convenience of description, in FIG. 1, first to fifth processing modules 12a, 12b, 12c, 12d, and 12e are illustrated and the processing modules 12 may be implemented as a software or hardware form.

An analog-digital conversion apparatus 10 according to various exemplary embodiments of the present invention includes a control unit 20 receiving an AD conversion request from the processing module 12 and transferring an AD conversion result to the processing module 12, a memory 30 temporarily storing the AD conversion request and the AD conversion result from the control unit 20, and an analog digital converter (ADC) 40 performing AD conversion by a request of the control unit 20.

The control unit 20 may include a transmission/reception unit 22 for transmitting/receiving a signal, a conversion information storing unit 24 storing information related to the processing module 12 requesting the AD conversion, and an AD conversion integrating unit 26 integrating the AD conversion request and transferring the AD conversion request to the memory 30.

The transmission/reception unit 22 may receive an analog signal from the processing module 12 and transfer the received analog signal to the memory 30. Furthermore, the transmission/reception unit 22 may receive a digital signal changed by the ADC 40 and transfer the received digital signal to the processing module 12.

The conversion information storing unit 24 may store information (AD conversion information) on the AD conversion requested by the processing module 12. The AD conversion information may include whether the AD conversion request is periodic, a period in the case of a periodic AD conversion request, a processing delay allowance time when the AD conversion request is aperiodic, channel information related to the ADC 40 to be allocated for the AD conversion request, and the like. The AD conversion information may be stored in the conversion information storing unit 24 in a table form.

The AD conversion integrating unit 26 may transfer a plurality of AD conversion requests to the memory 30 to integrate the plurality of AD conversion requests and convert the AD conversion requests at once in the ADC 40.

The ADC 40 may include a plurality of channel, and in various exemplary embodiments of the present invention, the ADC 40 may have eight channels and digitally convert the analog signal into a value of 10 bits. However, in the exemplary embodiment of the present invention, the ADC 40 may have various numbers of channels including 4 channels, 16 channels, etc., and an output digital value may also be smaller or greater than 10 bits.

FIG. 2 is a diagram exemplarily illustrating AD conversion information in an analog-digital conversion apparatus according to various exemplary embodiments of the present invention and FIG. 3A, FIG. 3B, and FIG. 3C are diagrams exemplarily illustrating that an AD conversion request is integrated and processed based on the AD conversion information illustrated in FIG. 2.

Referring to FIG. 2, the AD conversion information stored in the conversion information storing unit 24 is illustrated. The AD conversion information may be stored in advance or received from each processing module 12. The second processing module 12b and the fourth processing module 12d periodically request the AD conversion and the remaining processing modules 12a, 12c, and 12e aperiodically request the AD conversion. An AD conversion period of the second processing module 12b is 10 ms and the AD conversion period of the fourth processing module 12d is 20 ms. Delay allowance times of a first processing module 12a, a third processing module 12c, and a fifth processing module 12e are illustrated as 3, 2, and 5 ms, respectively after the AD conversion request. Furthermore, it is illustrated that in the first to fifth processing modules 12a to 12e, the channels of the ADC 40 are allocated with #1, 2, 4, 5, and 8.

The AD conversion integrating unit 26 integrates the AD conversion request by referring to the AD conversion information related to the conversion information storing unit 24 and this will be described below.

FIG. 3A illustrates periodic AD conversion processing, FIG. 3B illustrates an aperiodic AD conversion request together, and FIG. 3C illustrates that the AD conversion is integrated and processed.

Referring to FIG. 3A, the periodic AD conversion requests of the second processing module 12b and the fourth processing module 12d are processed at predetermined periods. In FIG. 2, the AD conversion period of the second processing module 12b and the fourth processing module 12d are illustrated as 10 ms and 20 ms, respectively, and AD conversion of the request of the second processing module 12b represented as ② and AD conversion of the request of the fourth processing module 12d represented as ④ in FIG. 3A, FIG. 3B, and FIG. 3C are performed according to the corresponding period.

However, as illustrated in FIG. 3B, it is assumed that there are an aperiodic AD conversion request of the first processing module 12a represented as ① an aperiodic AD conversion request of the third processing module 12c represented as ③, and an aperiodic AD conversion request of the fifth processing module 12e represented as ⑤.

In the case of Case A, the AD conversion request of the first processing module 12a is made of at 13 ms, the periodic AD conversion request of the second processing module 12b is scheduled at 15 ms, and referring to FIG. 2, the delay allowance time of the AD conversion of the first processing module 12a is 3 ms. In the instant case, as illustrated in FIG. 3C, the AD conversion of the first processing module 12a may be processed together with the AD conversion of the second processing module 12b and the AD conversion is performed through the allocated channel of the ADC 40. Referring to FIG. 2, the AD conversion requested by the first processing module 12a may be performed in channel 1 of the ADC 40 and the AD conversion requested by the second processing module 12b may be performed in channel 2 of the ADC 40.

In the case of Case B, the AD conversion request of the third processing module 12c is made of at 22 ms, but the subsequent periodic AD conversion is scheduled for the second processing module 12b at 25 ms. However, referring to FIG. 2, since the delay allowance time of the AD conversion of the third processing module 12c is 2 ms, the AD conversion request of the third processing module 12c may not be performed together with another periodic AD conversion, and as a result, separate AD conversion is performed.

In the case of Case C, the AD conversion request of the fifth processing module 12e is made of at 27 ms, the periodic AD conversion request of the fourth processing module 12d is scheduled at 30 ms, and referring to FIG. 2, the delay allowance time of the AD conversion of the fifth processing module 12e is 5 ms. In the instant case, as illustrated in FIG. 3C, the AD conversion of the fifth processing module 12e may be processed together with the AD conversion of the fourth processing module 12d.

In the case of Case D, the AD conversion request of the fifth processing module 12e is made of at 36 ms. Since the delay allowance time of the AD conversion of the fifth processing module 12e is 5 ms and another periodic AD conversion is not scheduled within the delay allowance time, the AD conversion should be individually performed. However, in the case of Case D, it may be possible to wait for another AD conversion request (AD conversion waiting) by considering the delay allowance time. Like Case D, when the AD conversion request of the first processing module 12a is made of at 38 ms, the AD conversions of the fifth processing module 12e and the first processing module 12a may be integrated and processed together. In the instant case, an AD conversion waiting time should be shorter than the delay allowance time and the AD conversion waiting time may be set differently according to a characteristic of a system.

Figure 4:
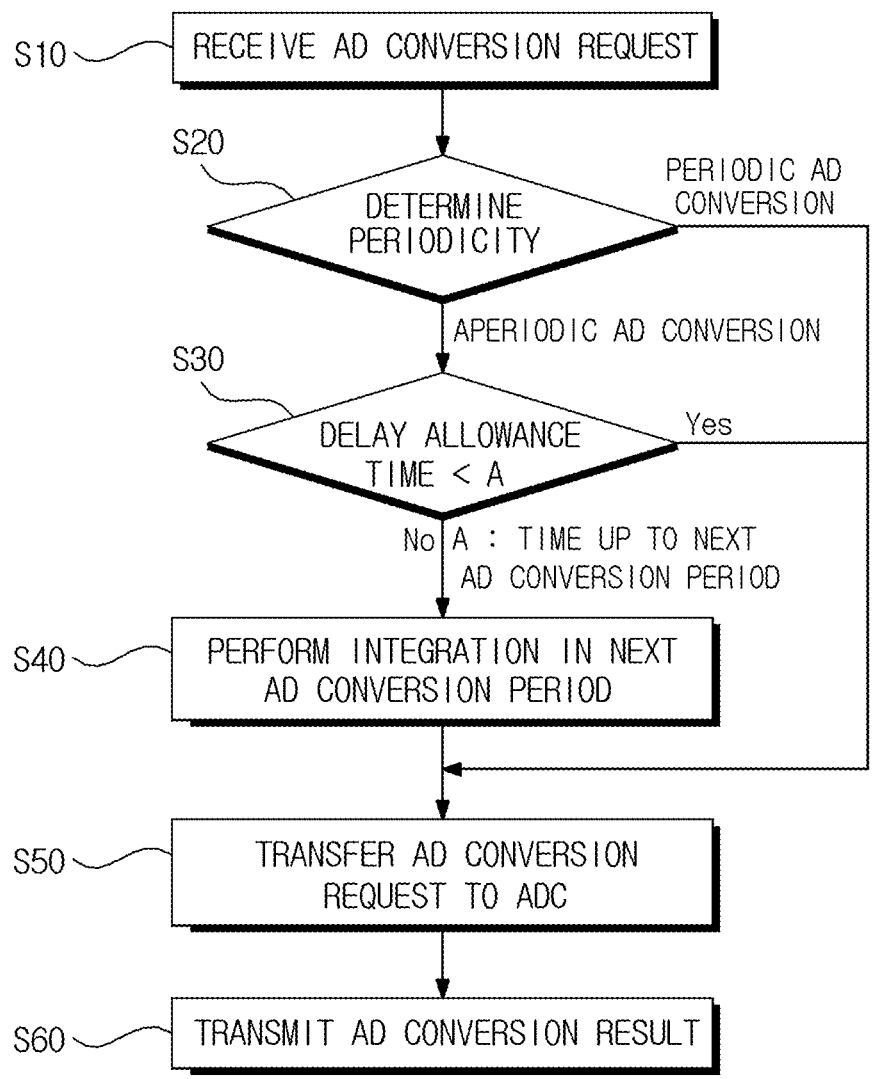
FIG. 4 is a flowchart illustrating an analog-digital conversion method according to various exemplary embodiments of the present invention.

FIG. 4 is a flowchart illustrating an analog-digital conversion method according to various exemplary embodiments of the present invention.

An analog-digital conversion apparatus 10 receives an AD conversion request from a processing module 12 (S10).

A control unit 20 of the analog-digital conversion apparatus 10 determines whether the received AD conversion request is periodic or aperiodic (S20). As described above, the control unit 20 may determine periodicity of an AD conversion request based on information stored in a conversion information storing unit 24.

When there is an aperiodic AD conversion request, the control unit 20 transfers the corresponding AD conversion request to an ADC 40 (S50).

When there is an aperiodic AD conversion request, the control unit 20 confirms a delay allowance time for the corresponding AD conversion request and compares the delay allowance time with a time A up to an earliest AD conversion period among next periodic AD conversions (S30).

As a determination result in step S30, when the delay allowance time is less than the time A up to the next AD conversion period, the corresponding AD conversion request should be immediately performed, and as a result, the AD conversion request is transferred to the ADC 40 (S50).

However, as the determination result in step S30, when the delay allowance time is equal to or greater than the time A up to the next AD conversion period, the corresponding AD conversion request is integrated at the next AD conversion period (S40) and the corresponding AD conversion request is allowed to be performed together with the AD conversion which is periodically performed (S50).

After step S50, the ADC 40 performs the AD conversion request transferred to the channel and transfers an AD conversion result to the control unit 20 (S60). The control unit 20 may transfer the AD conversion result to a processing module 12 again.

Meanwhile, in the exemplary embodiment of the present invention, as the determination result in step S30, when the delay allowance time is less than the time A up to the next AD conversion period, the corresponding AD conversion request may not be immediately performed and when there are other aperiodic AD conversion requests within an AD conversion waiting time (<delay allowance time), it may be possible to make the AD conversion request to the ADC by integrating the aperiodic AD conversion requests.

Figure 5:
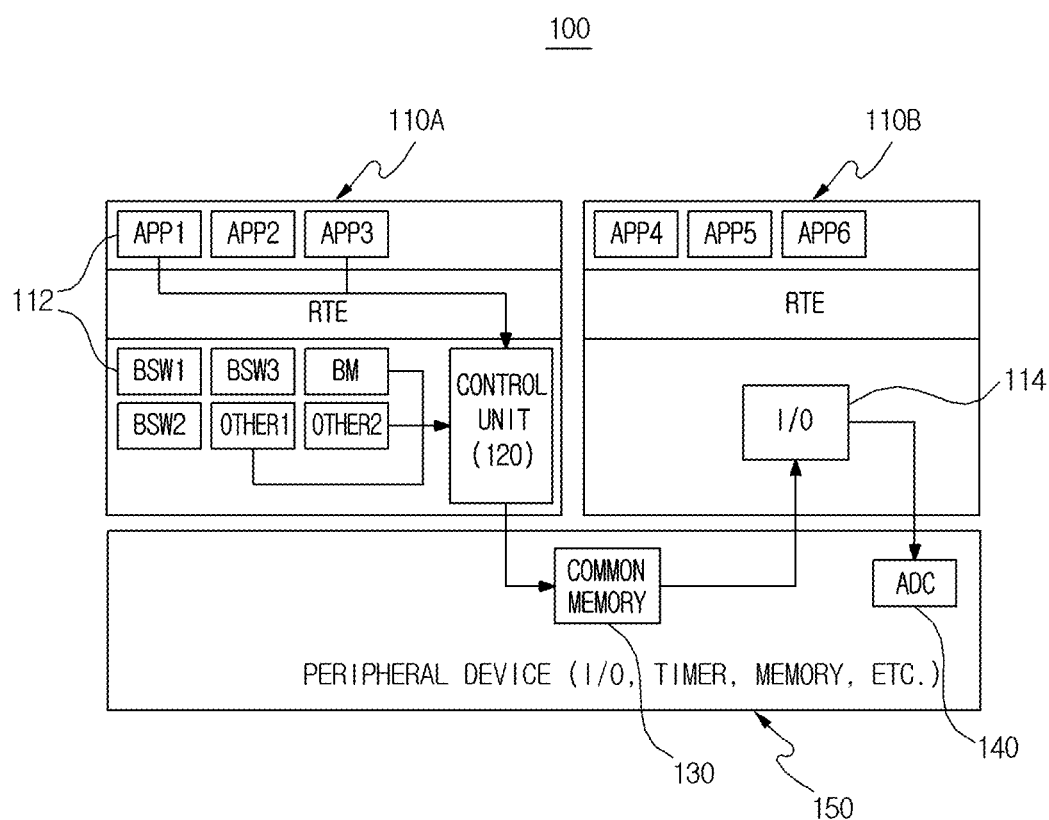
FIG. 5 is a block diagram of an analog-digital conversion apparatus according to various exemplary embodiments of the present invention.

FIG. 5 is a block diagram of an analog-digital conversion apparatus according to various exemplary embodiments of the present invention.

FIG. 5 illustrates a multi-core microprocessor based analog-digital conversion apparatus 100, which includes a first core 110A and a second core 110B, and a timer, a memory, and an ADC 140 are provided as peripheral apparatus 150.

The first core 110A and the second core 110B may be implemented by use of an AUTOSAR based software platform and may include basic software (BSW) modules and application software components (APP) which operate thereon, and a runtime environment (RTE) that supports communication therebetween. Basic software (BSW) modules (BSW1, BSW2, BSW3, Battery Management BM, other1, and other2) and application software components (APP1, APP2, and APP3) may request the AD conversion to the control unit 120.

The control unit 120 may be configured to perform the same function as the control unit 20 described by referring to FIG. 1.

The control unit 120 may integrate and transfer the AD conversion request to a common memory 130 with respect to the AD conversion request.

The AD conversion request in the control unit 120 may be transferred to the ADC 140.

In various exemplary embodiments of the present invention, the second core 110B may mediate the AD conversion request to the ADC 140. That is, the AD conversion request integrated by the first core 110A may be stored in the common memory 130 and the second core 110B may receive the AD conversion request stored in the common memory 130 by use of an input/output apparatus (I/O) 114 and request the AD conversion to the ADC 140. Furthermore, the second core 110B may receive an AD conversion result in the ADC 140 and transfers the AD conversion result to the control unit 120 of the first core 110A through the common memory 130.

In such a structure, in a multi-core microprocessor constituted by a plurality of cores, any one core is set as the second core 110B in FIG. 5 and other cores transfer the AD conversion request to the second core 110B to allow a specific core to charge and process the AD conversion request in a relationship with the ADC 140.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An analog-digital conversion apparatus comprising:
   a control unit configured for receiving an analog-digital (AD) conversion request from a plurality of processing modules; and
   an analog-digital converter (ADC) configured for performing AD conversion according to the AD conversion request received from the control unit,
   wherein the control unit is configured to integrate the AD conversion request according to periodicity of the AD conversion request and to transfer the integrated AD conversion request to the ADC.

2. The analog-digital conversion apparatus of claim 1, wherein upon determining that the AD conversion request is periodic, the control unit is configured to transfer the AD conversion request to the ADC at a predetermined time interval.

3. The analog-digital conversion apparatus of claim 1, wherein upon determining that the AD conversion request is an aperiodic AD conversion request, the control unit is configured to integrate a periodic AD conversion request to be performed after the aperiodic AD conversion request, and the aperiodic AD conversion request.

4. The analog-digital conversion apparatus of claim 3, wherein in the aperiodic AD conversion request, a delay allowance time which is an allowable delay time for the AD conversion is set, and
upon determining that the delay allowance time is equal to or greater than a time up to the periodic AD conversion request, the control unit is configured to integrate the aperiodic AD conversion request in the periodic AD conversion request.

5. The analog-digital conversion apparatus of claim 3, wherein in the aperiodic AD conversion request, the delay allowance time which is the allowable delay time for the AD conversion is set, and
upon determining that the delay allowance time is less than a time up to the periodic AD conversion request, the control unit processes the aperiodic AD conversion request separately from the periodic AD conversion request.

6. The analog-digital conversion apparatus of claim 5, wherein upon determining that the aperiodic AD conversion request is separately processed from the periodic AD conversion request, aperiodic AD conversion requests are integrated and processed upon determining that another aperiodic AD conversion request is received within an AD conversion waiting time less than the delay allowance time.

7. The analog-digital conversion apparatus of claim 1, wherein the control unit includes:
a transmission/reception unit configured for transmitting and receiving a signal,
a conversion information storing unit configured for storing information related to the plurality of processing modules requesting the AD conversion, and
an AD conversion integrating unit configured for integrating and transferring the AD conversion request.

8. The analog-digital conversion apparatus of claim 7, wherein the conversion information storing unit is configured to store, as conversion information, whether the AD conversion request is periodic, a delay allowance time upon determining that the AD conversion request is aperiodic, and channel information related to the ADC to be allocated for the AD conversion request.

9. The analog-digital conversion apparatus of claim 1, further including:
a multi-core microprocessor including, a first core, a second core, and a peripheral apparatus,
wherein the plurality of processing modules and the control unit are provided in the first core,
wherein the ADC is included in the peripheral apparatus, and
wherein an input/output apparatus configured for receiving the AD conversion request in the control unit and transferring the AD conversion request to the ADC is provided in the second core.

10. The analog-digital conversion apparatus of claim 9, wherein the peripheral apparatus includes a common memory configured for receiving the AD conversion request from the first core and for a predetermined time storing the AD conversion request and for a predetermined time storing an AD conversion result from the ADC.

11. A method of converting an analog signal into a digital signal in an analog-digital conversion apparatus, the method comprising:
(a) receiving, by a control unit, an analog-digital (AD) conversion request from a plurality of processing modules;
(b) determining, by the control unit, periodicity of the AD conversion request; and
(c) upon determining that the AD conversion request is an aperiodic AD conversion request, performing, by the control unit, AD conversion by integrating a periodic AD conversion request to be performed after the aperiodic AD conversion request, and the aperiodic AD conversion request.

12. The method of claim 11, wherein in the step (c), a delay allowance time of the aperiodic AD conversion request and a time up to the periodic AD conversion request to be performed after the aperiodic AD conversion request are compared with each other by the control unit and upon determining that the delay allowance time is equal to or greater than the time, the aperiodic AD conversion request is integrated with the periodic AD conversion request by the control unit.

13. The method of claim 11, wherein in the step (c), the delay allowance time of the aperiodic AD conversion request and a time up to the periodic AD conversion request to be performed after the aperiodic AD conversion request are compared with each other by the control unit and upon determining that the delay allowance time is less than the time, the aperiodic AD conversion request is separately processed by the control unit from the periodic AD conversion request.

14. The method of claim 13, wherein upon determining that the aperiodic AD conversion request is separately processed from the periodic AD conversion request, aperiodic AD conversion requests are integrated and processed upon determining that another aperiodic AD conversion request is received within an AD conversion waiting time less than the delay allowance time.

15. The method of claim 11, wherein the analog-digital conversion apparatus includes:
the control unit configured for receiving the AD conversion request from the plurality of processing modules; and
an analog-digital converter (ADC) configured for performing the AD conversion according to the AD conversion request received from the control unit.

16. The method of claim 15, wherein the control unit includes:
a transmission/reception unit configured for transmitting and receiving a signal,
a conversion information storing unit configured for storing information related to the plurality of processing modules requesting the AD conversion, and
an AD conversion integrating unit configured for integrating and transferring the AD conversion request.

17. The method of claim 16, wherein the conversion information storing unit is configured to store, as conversion information, whether the AD conversion request is periodic, a delay allowance time upon determining that the AD conversion request is aperiodic, and channel information related to the ADC to be allocated for the AD conversion request.

18. The method of claim 11, further including:
a multi-core microprocessor including, a first core, a second core, and a peripheral apparatus,
wherein the plurality of processing modules and the control unit are provided in the first core,
wherein the ADC is included in the peripheral apparatus, and
wherein an input/output apparatus configured for receiving the AD conversion request in the control unit and transferring the AD conversion request to the ADC is provided in the second core.

19. The method of claim 18, wherein the peripheral apparatus includes a common memory configured for receiving the AD conversion request from the first core and for a predetermined time storing the AD conversion request and for a predetermined time storing an AD conversion result from the ADC.

* * * * *